(12) United States Patent
Bravo

(10) Patent No.: US 6,173,848 B1
(45) Date of Patent: Jan. 16, 2001

(54) MOUNTING SHELF FOR INSTALLATION OF LAN HUBS

(75) Inventor: Donna Bravo, Marlborough, MA (US)

(73) Assignee: 3Com Corporation, Santa Clara, CA (US)

( * ) Notice: Under 35 U.S.C. 154(b), the term of this patent shall be extended for 0 days.

(21) Appl. No.: 09/415,571

(22) Filed: Oct. 8, 1999

(51) Int. Cl.[7] .................................................. A47B 43/00
(52) U.S. Cl. .............................................................. 211/187
(58) Field of Search ................................... 211/187, 90.1, 211/90.2, 134, 153

(56) References Cited

U.S. PATENT DOCUMENTS

| | | | |
|---|---|---|---|
| 4,116,509 | * | 9/1978 | Smith ..................................... 212/187 |
| 4,537,316 | * | 8/1985 | Simon et al. .......................... 211/187 |
| 5,644,993 | * | 7/1997 | Dohnalik ............................... 211/187 |

* cited by examiner

Primary Examiner—Alvin Chin-Shue
Assistant Examiner—Sarah Purol
(74) Attorney, Agent, or Firm—McGlew and Tuttle, P.C.

(57) ABSTRACT

A mounting shelf or bracket support element is provided which includes a back engaging part and a chassis support portion to provide a shelf structure. A rack engaging part includes a first pin for engaging a left rail opening of the rack and a second pin for engaging a right rail opening of the rack. The pins engage the opening of either the left or right rail of the rack disposing the chassis support portion in a position extending substantially horizontally. The bracket side portions are labeled with indicia such as L and R for Left and Right. A system is also provided which uses the left and right indicia on each bracket element and also preferably uses openings in the bracket to locate the proper position of the chassis relative to openings of the rail. A process for mounting a chassis to a rack is also provided including providing a bracket support element, using the bracket pin to engage the opening of either the left or right rail of the rack, fixing the brackets to a rail by inserting a screw into the aligned openings and disposing a chassis on the support portions.

18 Claims, 5 Drawing Sheets

MOUNTING SHELF FOR INSTALLATION OF LAN HUBS

FIELD OF THE INVENTION

The invention relates generally to rack mounted electronics components and more particularly to rack mounted Local Area Network (LAN) Hub systems.

BACKGROUND OF THE INVENTION

Rack mounted systems are used extensively for electronics components. Typically, the racks include edge structures or rails with a series of openings which receive bolts or screws for installing the chassis of the electronics component in the rack.

LAN systems typically use hubs which are relatively large and provide numerous slots for network systems modules. Typically at installation of the hub to a rack system, the chassis weighs between 110 to 220 pounds. The chassis installation can require up to three individuals to both support the chassis and insert the screws into the rack.

SUMMARY AND OBJECTS OF THE INVENTION

It is an object of the invention to provide a bracket support element providing a mounting shelf which can be used to mount chassis to rack units wherein the bracket element quickly connects to the rack and provides at least temporary support to the chassis while the chassis is appropriately fixed to the rack.

According to the invention, a mounting shelf or bracket support element is provided which includes a back engaging part and a chassis support portion to provide a shelf structure. A rack engaging part includes a first pin for engaging a left rail opening of the rack and a second pin for engaging a right rail opening of the rack. The pins engage the opening of either the left or right rail of the rack disposing the chassis support portion in a position extending substantially horizontally.

The bracket support may be formed of sheet steel. One piece is folded to form an edge defining the position of the chassis support portion relative to a bracket back. The angle formed by the fold is preferably about 90 degrees. A bracket first side portion and a bracket second side portion are formed at lateral side edges. The bracket first side and a bracket second side also form about a 90 degree angle with the bracket back. The pins are supported by the bracket side portions and extend toward the opposite bracket side portion. Openings are preferably provided in the bracket side portions which correspond to the general area of the openings on the rails of the rack. This allows a rack openings to be viewed visually, even if they are behind the bracket side portions. A screw is inserted into each opening and through the associated rack opening to connect the bracket support to the rail of the rack.

Preferably the bracket side portions are labeled with indicia such as L and R for Left and Right. This corresponds with the first bracket side portion (on the left when viewing the bracket from the side of the chassis support portion) being used to engage the openings of a left rail of the rack. In a similar manner the second side bracket portion is provided with the indicia R (the side to the right when viewing the bracket from the side chassis support portion) being used to engage openings on the right rail of the rack.

It is another object of the invention to provide a rack mounting system which is especially useful for large and/or heavy electronics components chassis wherein bracket supports are used to position and temporarily support the chassis while the chassis is attached to the rack.

The system uses the left and right indicia on each bracket element and also preferably uses openings in the bracket to locate the proper position of the chassis relative to openings of the rail. With a bracket inserted on the left and/or right rail the bracket is fixed to the rail using screws and clip nuts and the aligned openings of the rack. The chassis is positioned, supported and fixed in the appropriate position with connections to openings of the rails of the rack. The brackets may be removed by removing the screws and then removing the pins of each bracket from an opening of a rail of the rack. The chassis is then supported by its connections to the rack.

It is still another object of the invention to provide a process for mounting a chassis to a rack including providing a bracket support element with a back engaging part and a chassis support portion to provide a shelf structure. A rack engaging part includes a first pin for engaging a left rail opening of the rack and a second pin portion for engaging a right rail opening of the rack. A bracket pin engages the opening of either the left or right rail of the rack disposing the chassis support portion in a position extending substantially horizontally. Preferably two brackets are provided. The pin of the bracket is inserted into a rack opening at each rail of the rack to provide chassis support portions extending out from each rail. The brackets are preferably each fixed to a rail by inserting a screw into the aligned openings of the bracket and of the rail. The chassis is disposed on the chassis support portions. The chassis is fixed to each rail. Each bracket may then be removed.

The process preferably also includes providing the bracket as a substantially symmetrical element with indicia provided on each of a left and right side of the bracket wherein the indicia indicates the rail (left or right) which the bracket side is intended to connect to. The bracket further preferably provides openings in side parts of the bracket to register the position of the bracket, and the electronics component chassis, relative to the rack and to fix the bracket to the rail. Further, other markings or indicia may be provided on the bracket to register the position of the bracket relative to a position along a rail of the rack. The indicia on the bracket may be combined with indicia on the rail or a template to coordinate the positions and thereby accurately position the chassis.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which a preferred embodiment of the invention is illustrated.

DESCRIPTION OF THE PREFERRED EMBODIMENT

Figure 1:
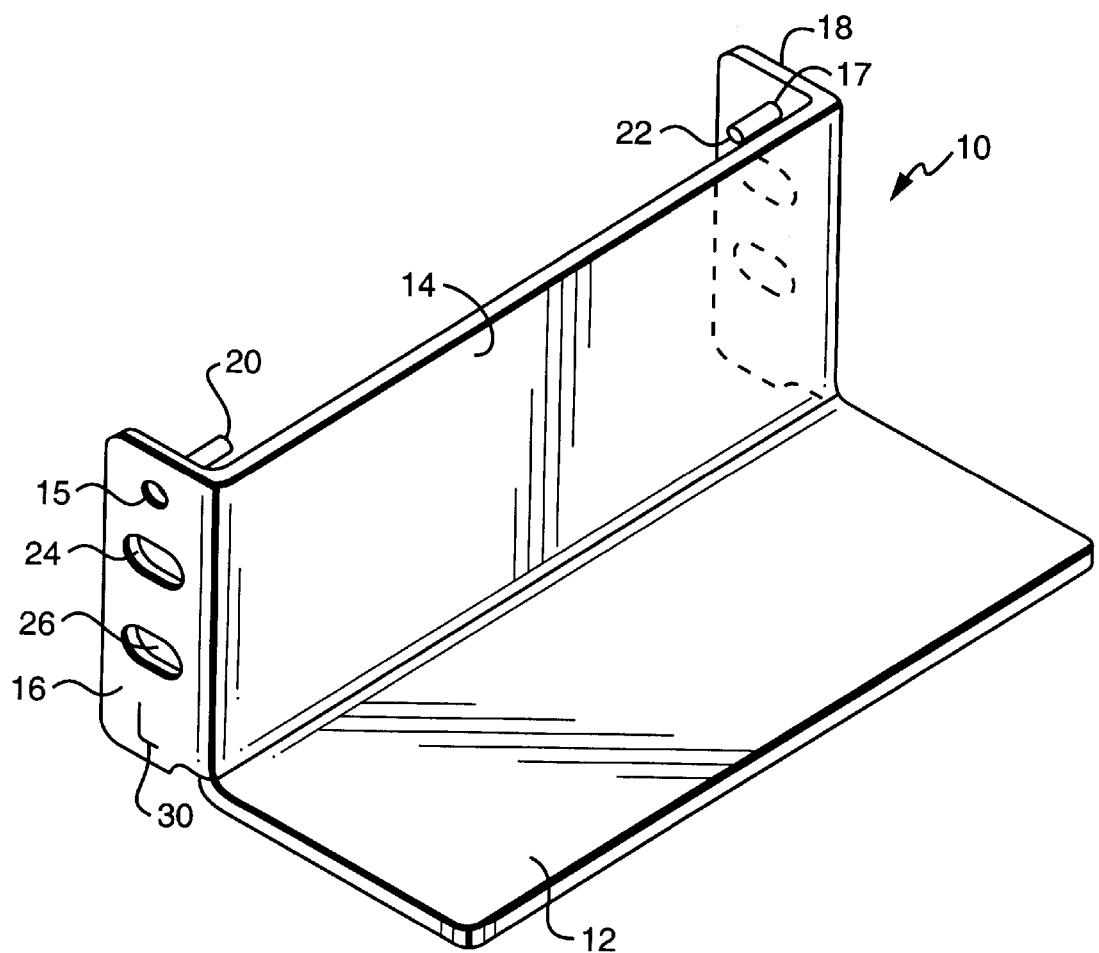
FIG. 1 is a perspective view of the bracket support according to the invention.
Figure 2:
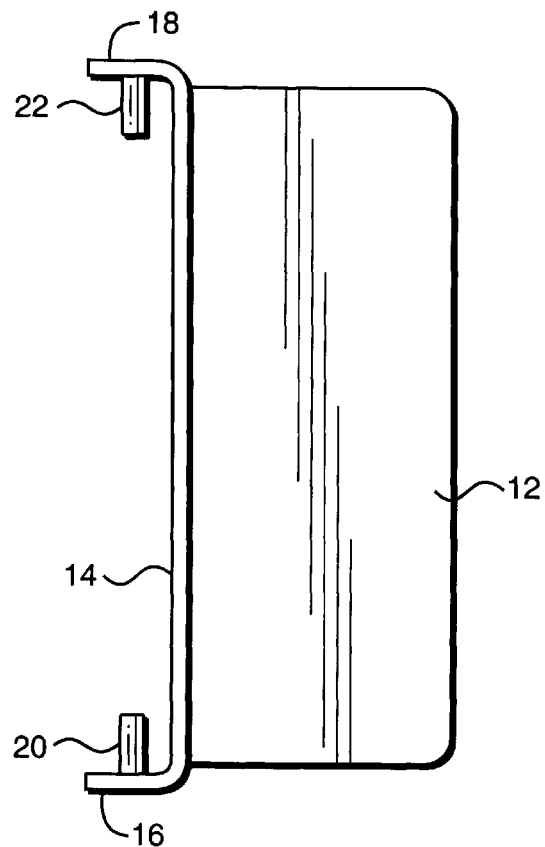
FIG. 2 is a top view of the bracket support according to the invention.
Figure 3:
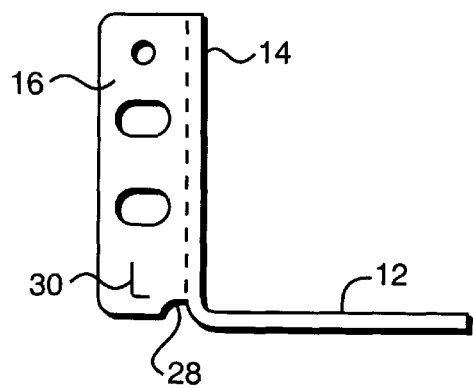
FIG. 3 is a side end view of the bracket according to the invention.

Referring to the drawings in particular, the invention comprises a mounting shelf or bracket support generally designated 10. The bracket support is formed of sheet steel and includes a single sheet steel piece with a fold to form the chassis support portion 12 and the bracket back 14. Two lateral folds are provided to form the bracket first side 16 and the bracket second side 18. An opening 15 is provided in the bracket first side 16 and a pin 20 is positioned in the opening and fixed there relative to sheet metal piece. In a similar manner the bracket second side 18 has an opening 17 with a pin 22 supported by the bracket second side 18. The support of the pins 20 and 22 is preferably by a press fit of the pins 20 and 22 into the openings 15 and 17, respectively, of the sheet metal piece. However, these may also be welded and it is also possible to provide the entire unit as a single molded piece (other materials may also be used).

Figure 6:
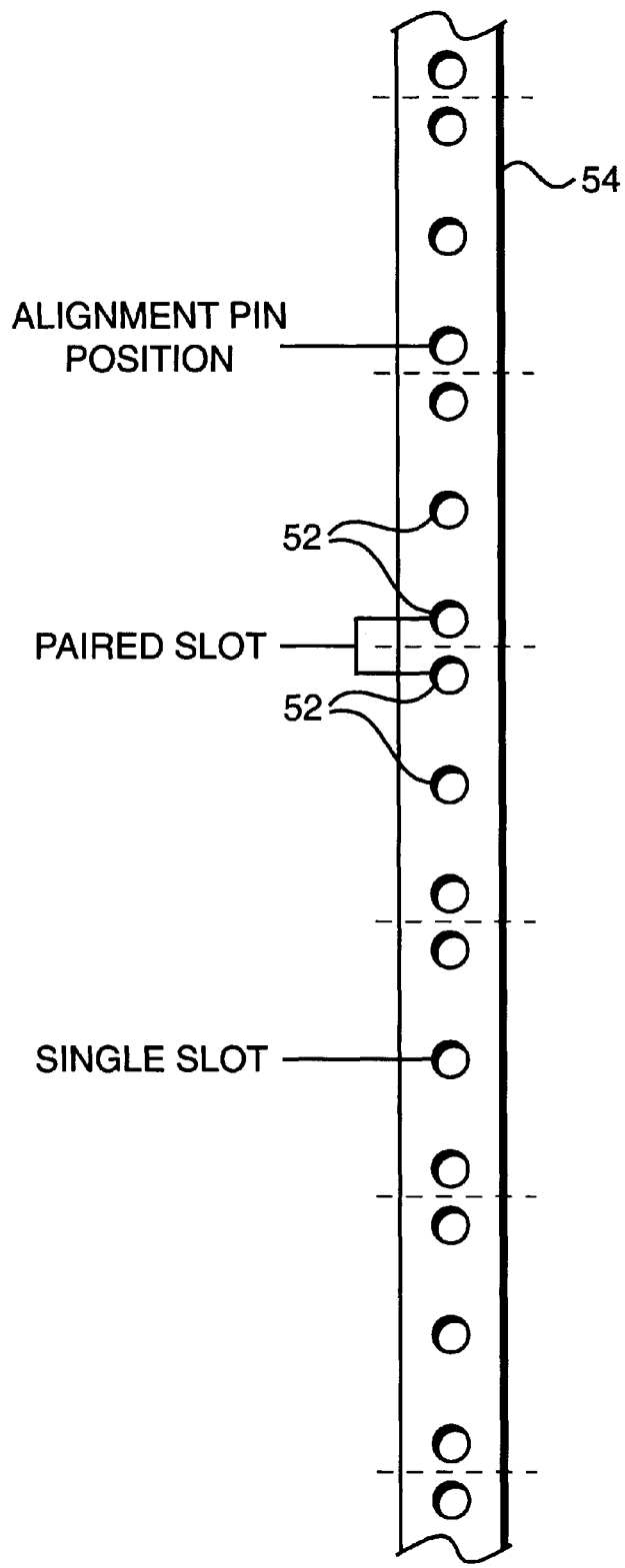
FIG. 6 is a view showing a rack rail single and paired opening arrangement.

The bracket first side 16 and bracket second side 18 preferably have openings 24 and 26. These openings 24 and 26 are disposed relative to associated pin 20 and 22 based on spacing of holes 52 on a rail of rack 50 (see FIG. 6).

The bracket first side 16 is provided with left indicia 30. This bracket first side (on the left when viewing the bracket from the side of chassis support portion 12) has the associated pin 20 and bracket support portion 12 situated so as to be the side for engagement with the left rail 54 of the rack. Bracket second side 18 (on the right side of the bracket when viewing the bracket from the side of the chassis support portion 12) is provided with right indicia 32. The bracket second side 18 has the pin 22 which engages a hole 52 on the right rail 56 of the rack. The bracket sides 16 and 18 have notches 28 that facilitate the formation of the bracket 10.

Figure 4:
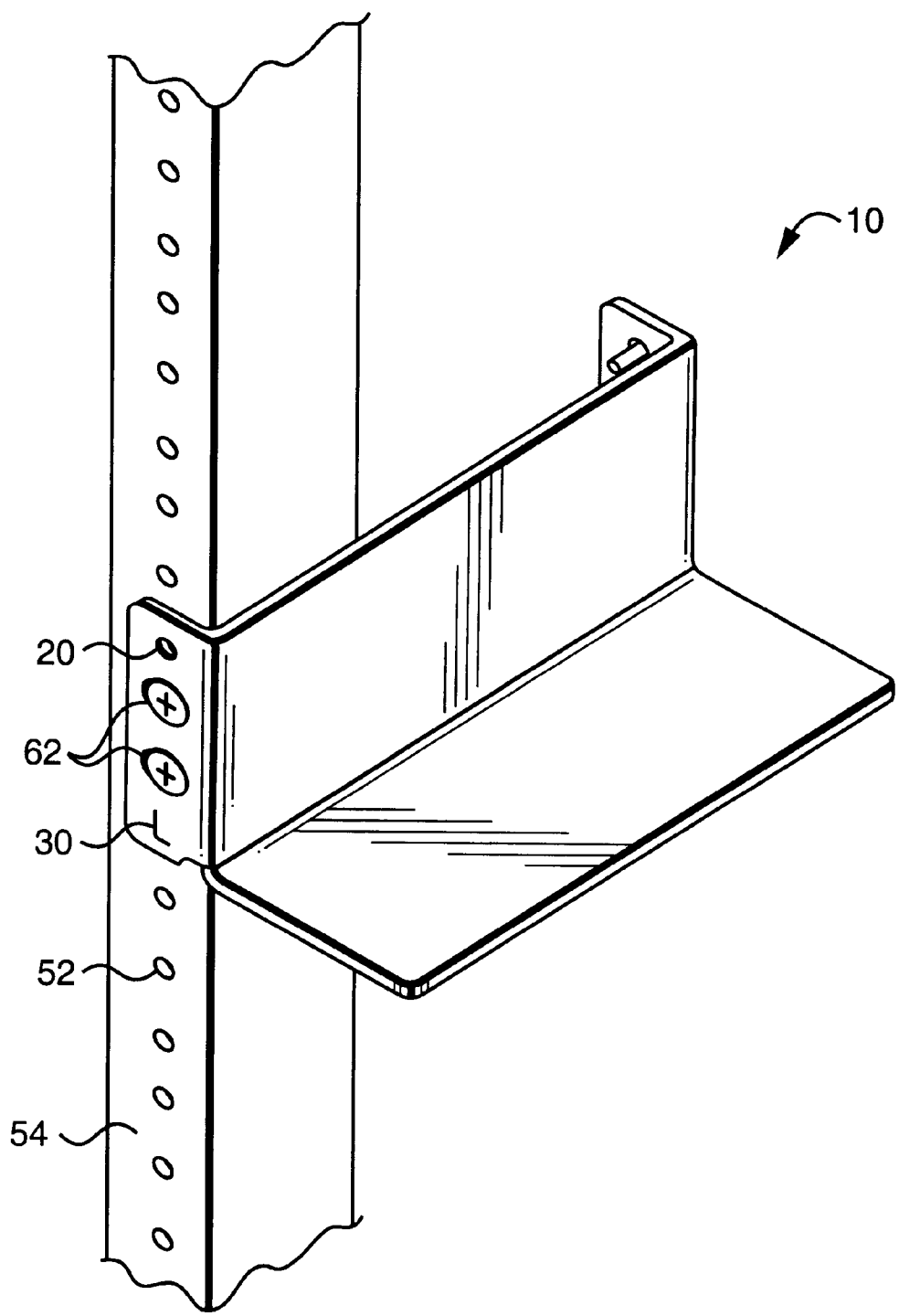
FIG. 4 is a perspective view of the left rail side of the mounting shelf and rail system according to the invention.
Figure 5:
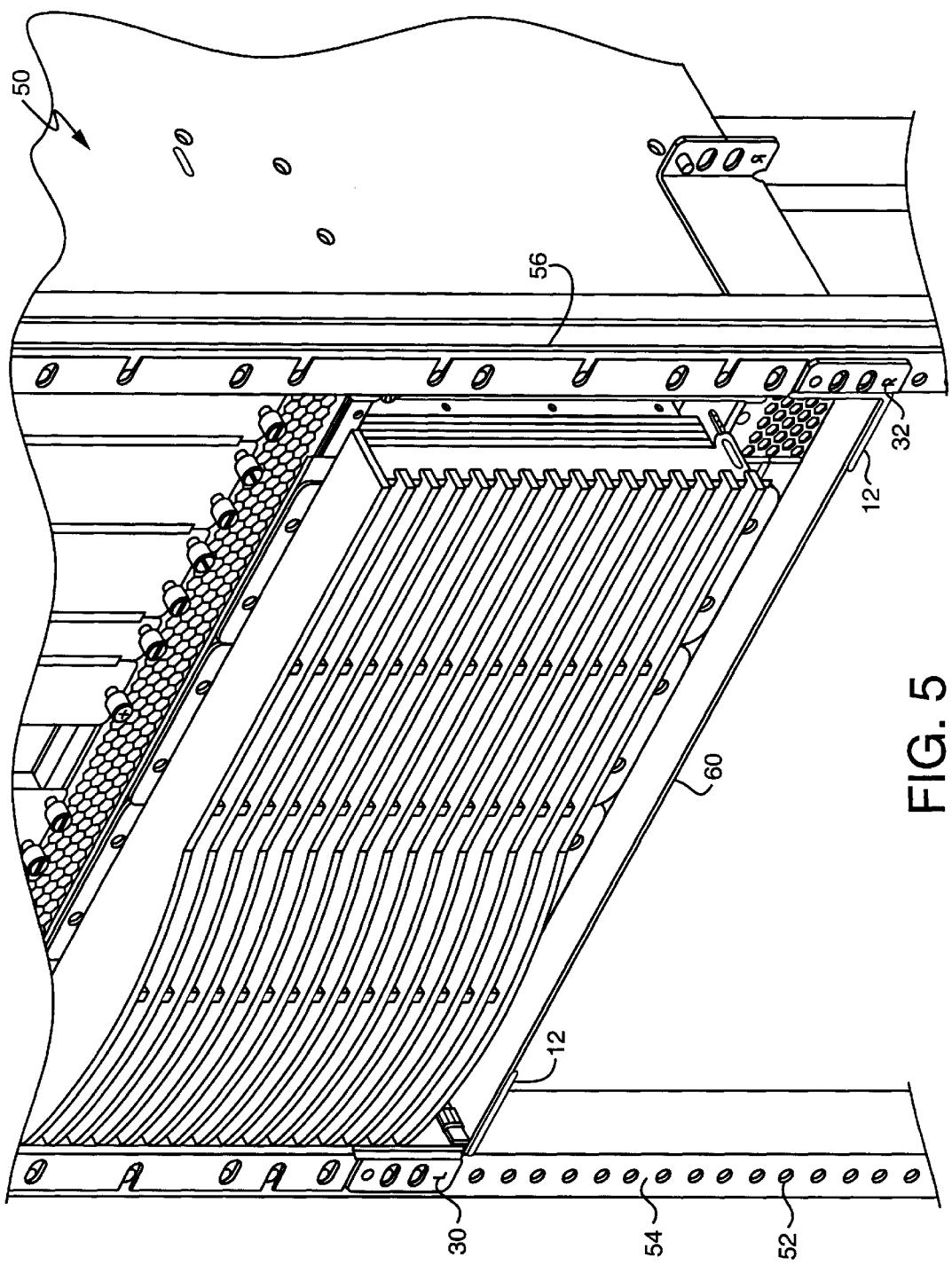
FIG. 5 is a perspective view of the mounting shelf and rail system showing the chassis in place.

The systems of the inventions is shown in FIGS. 4 and 5. Two identical bracket support elements 10 are provided for mounting a chassis. One bracket support 10 is connected with the left indicia 30 showing and with an alignment pin 20 inserted in an opening 52 of left rack 54. Openings 24 and 26 can be used to properly position the bracket support 10 and to fix it with screws 62 through the aligned holes of the bracket and rail. In a similar manner an other bracket support 10 is positioned connected to the right rail 56. In this situation the right indicia 32 is showing and openings 24 and 26 may be used to properly position the mounting shelf or bracket 10 and to select the position of the chassis and to fix the mounting shelf or bracket 10 with screws 62 through the aligned holes of the bracket and rail. As an alternative, to facilitate installation, markings may be provided along the rail which are coordinated with markings on the brackets 10.

As shown in FIG. 5 a chassis 60 is inserted into the rack, between left rail 54 and right rail 56. The two mounting shelves 10 provide two chassis support portions 12 extend inwardly between the left rail 54 and the right rail 56. There are fixed to the rail via the pins 20 and 22 and by screws in openings 24 and 26. Chassis 60 is supported by the extending chassis support portions 12. The chassis is fixed to the rack with screws. The brackets 10 may be removed. This may be done by removing the screws and by removing pin 20 of the left side and removing the pin 22 of the right side whereby the two brackets move and slide out vertically and downwardly.

A chassis template paper device (an accurate copy of the chassis rack-mount flange) may be used to help position the mounting brackets (shelves) and the chassis when it is installed into the rack. The chassis template is designed for use with one or more rack types.

Two mounting shelves 10 and sets of screws 62 are used. One mounting shelf 10 is installed on each side of the rack. The top slot on the mounting shelf is equipped with alignment pins 20, 22 to help insert and position the mounting shelf in the rack. One screw 62 per mounting shelf may support an empty chassis 60, however two screws 62 are preferably used. The chassis 60 is secured to the rack before any other components are added.

The mounting shelves are installed by the following steps:
1. The chassis rack-mount template, two mounting shelves and four screws are provided;
2. The location of installation of the mounting shelves is determined.
    a The template is held in place, the slots or openings 52 on each rack rail (54, 56), to mount shelves, are located.
    b The desired positions on the rack are marked.
    The rack has a series of paired and singled slots or openings 52 that are positioned with specific distances between each slot (FIG. 6).
3. A mounting shelf is inserted in the rack.
    a The desired rack slot position is selected, using the top slot of a pair of slots for the mounting shelf alignment pin 20 (FIG. 6).
    b The alignment pin 20 is inserted into the rack slot.
    (If the rack used is not threaded (openings 52 have no threading) then clip nuts should be used. The alignment pins 20, 22 on the mounting shelf will then insert easily into the rack).
4. Using a Phillips-head or flat-head screwdriver the two screws 62 are inserted and tightened.
5. Steps 3 and 4 are repeated to mount the other shelf 10 on the opposite rack rail 56. The mounting shelves 10 must be aligned to the same rack slot positions on both sides of the rack.
6. The chassis 60 is slid into the rack, using the mounting shelves 10 for support, until both rack-mount flanges are flush with the front of the rack.
7. While the chassis 60 rests on the mounting shelf, screws are inserted and tightened.

While specific embodiments of the invention have been shown and described in detail to illustrate the application of the principles of the invention, it will be understood that the invention may be embodied otherwise without departing from such principles.

What is claimed is:

1. A bracket for a rack mounted chassis, the bracket comprising:
   a first bracket side portion;
   a second bracket side portion;
   a central portion including a chassis support portion and a bracket back extending between said first side portion and said second side portion;
   a first side pin supported by said first side portion and extending from said first side portion adjacent to said central portion;
   a second side pin supported by said second side portion and extending from said second side portion adjacent to said central portion whereby the bracket is connected to the rack with one of said first side pin and said second side pin engaging a hole in a rail of the rack to form a left or right side support for the chassis.

2. The bracket for rack mounted chassis according to claim 1, wherein one of said first side portion and said second side portion is marked as a left side for connection of the associated pin to a left side rail of the rack and the other of said first side portion and said second side portion is marked as a right side for connection of the associated pin to a right side rail of the rack.

3. The bracket for rack mounted chassis according to claim 1, wherein the bracket support is formed of a sheet of steel folded to form an edge defining the position of the chassis support portion relative to a bracket back.

4. The bracket for rack mounted chassis according to claim 2, wherein an angle formed between said chassis support portion relative to said bracket back is preferably about 90 degrees.

5. The bracket for rack mounted chassis according to claim 1, wherein said pins are supported by the bracket side portions and extend toward the opposite bracket side portion, said pins being pressed into a respective opening provided in said bracket side portions, said bracket side portions each having additional openings spaced from said pins at a distance which corresponds to a distance between openings on the rails of the rack.

6. The bracket for rack mounted chassis according to claim 1, wherein said first bracket side portion, which is on the left when viewing the bracket from the side of the chassis support portion, is used to engage the openings of a left rail of the rack and said second bracket side portion, which is on the right when viewing the bracket from the side of the chassis support portion, is used to engage openings on the right rail of the rack.

7. The bracket for rack mounted chassis according to claim 6, wherein said first bracket side portion is provided with indicia including the letter L and said second bracket side portion is provided with indicia including the letter R.

8. A chassis mounting system, comprising:
   a rack with left and right rails, each rail having a plurality of rail openings;
   a first mounting shelf with a first shelf first side portion, a first shelf second side portion, a first shelf lower support portion, a first shelf back portion extending between said first shelf first side portion and said first shelf second side portion, a first shelf first side pin supported by said first shelf first side portion and extending from said first shelf first side portion adjacent to said first shelf back and a first shelf second side pin supported by said first shelf second side portion and extending from said first shelf second side portion adjacent to said first shelf back;
   a second mounting shelf with a second shelf first side portion, a second shelf second side portion, a second shelf lower support portion, a second shelf back portion extending between said second shelf first side portion and said second shelf second side portion, a second shelf first side pin supported by said second shelf first side portion and extending from said second shelf first side portion adjacent to said second shelf back and a second shelf second side pin supported by said second shelf second side portion and extending from said second shelf second side portion adjacent to said second shelf back;
   indicia designating a left side on each of said a first shelf first side portion and said second shelf first side portion;
   indicia designating a right side on each of said a first shelf second side portion and said second shelf second side portion.

9. The system according to claim 8, wherein each mounting shelf is formed of a sheet of steel folded to form an edge defining the position of the support portion relative to the back.

10. The system according to claim 9, wherein an angle formed between each support portion and associated said back is preferably about 90 degrees.

11. The system according to claim 8, wherein said indicia designating pins are supported by the bracket side portions and extend toward the opposite bracket side portion, said pins being pressed into a respective opening provided in said bracket side portions, said bracket side portions each having additional openings spaced from said pins at a distance which corresponds to a distance between openings on the rails of the rack.

12. The system according to claim 8, further comprising screws for insertion into said additional openings and into openings of the rack for fixing the shelves to the associated rail of the rack.

13. The system according to claim 8, wherein said indicia designating left is the letter L and said indicia designating right is the letter R and said first mounting shelf is substantially identical to said second mounting shelf.

14. A chassis mounting process, comprising the steps of:
   providing a rack with left and right rails, each rail having a plurality of rail openings;
   providing a first mounting shelf with a first shelf first side portion, a first shelf second side portion, a first shelf lower support portion, a first shelf back portion extending between said first shelf first side portion and said first shelf second side portion, a first shelf first side pin supported by said first shelf first side portion and extending from said first shelf first side portion adjacent to said first shelf back and a first shelf second side pin supported by said first shelf second side portion and extending from said first shelf second side portion adjacent to said first shelf back;

providing a second mounting shelf with a second shelf first side portion, a second shelf second side portion, a second shelf lower support portion, a second shelf back portion extending between said second shelf first side portion and said second shelf second side portion, a second shelf first side pin supported by said second shelf first side portion and extending from said second shelf first side portion adjacent to said second shelf back and a second shelf second side pin supported by said second shelf second side portion and extending from said second shelf second side portion adjacent to said second shelf back;

inserting the first shelf first pin into an opening of the left rail of the rack to provide the first shelf support portion extending toward the right rail;

inserting the first shelf first pin into an opening of the left rail of the rack to provide the first shelf support portion extending toward the right rail;

disposing the chassis on the support portions; and fixing the chassis to each rail.

15. The process according to claim 14, further comprising:
providing indicia designating a left side on each of said a first shelf first side portion and said second shelf first side portion; and
providing indicia designating a right side on each of said a first shelf second side portion and said second shelf second side portion.

16. The process according to claim 14, further comprising:
removing each mounting shelf after fixing the chassis.

17. The process according to claim 14, further comprising: providing each mounting shelf as a substantially symmetrical element with first mounting shelf being substantially identical to said second mounting shelf.

18. The process according to claim 14, further comprising:
providing openings in side parts of each mounting shelf and fixing each mounting shelf to a rail with screws inserted into said openings.

* * * * *